United States Patent
Harada et al.

(10) Patent No.: US 6,255,872 B1
(45) Date of Patent: Jul. 3, 2001

(54) CHARGE PUMP CIRCUIT FOR PLL

(75) Inventors: Hirotaka Harada; Susumu Tanimoto, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/276,933

(22) Filed: Mar. 26, 1999

(30) Foreign Application Priority Data

Mar. 26, 1999 (JP) .................................................. 10-079787

(51) Int. Cl.⁷ ....................................................... H03L 7/06
(52) U.S. Cl. .......................................... 327/157; 327/148
(58) Field of Search ..................................... 327/148, 157, 327/147, 156, 534, 535, 536, 537

(56) References Cited

U.S. PATENT DOCUMENTS

| | | | |
|---|---|---|---|
| 4,689,581 | 8/1987 | Talbot ........................................ | 331/1 |
| 4,792,705 | 12/1988 | Ouyang et al. ......................... | 327/376 |
| 5,473,283 | 12/1995 | Luich ........................................ | 331/8 |
| 5,534,821 | 7/1996 | Akiyama et al. ......................... | 331/8 |
| 5,663,686 | 9/1997 | Tada ........................................ | 331/8 |
| 5,767,736 | * 6/1998 | Lakshmikumar et al. ............ | 327/536 |
| 5,801,578 | * 9/1998 | Bereza ................................... | 327/536 |
| 5,912,575 | * 6/1999 | Takikawa .............................. | 327/157 |
| 6,054,882 | * 4/2000 | Izumikawa ............................ | 327/157 |

FOREIGN PATENT DOCUMENTS

| | | |
|---|---|---|
| 2204476 | 12/1997 | (CA) . |
| 0 545 517 | 6/1993 | (EP) . |
| 55-64437 | 5/1980 | (JP) . |
| 62-234415 | 10/1987 | (JP) . |
| 5-243944 | 9/1993 | (JP) . |
| 6-349294 | 12/1994 | (JP) . |
| 7-86927 | 3/1995 | (JP) . |
| 07143002 | 6/1995 | (JP) . |
| 08330953 | 12/1996 | (JP) . |
| 8-330953 | 12/1996 | (JP) . |
| 9-298462 | 11/1997 | (JP) . |

* cited by examiner

Primary Examiner—Tuan T. Lam
(74) Attorney, Agent, or Firm—Foley & Lardner

(57) ABSTRACT

A charge pump circuit for a PLL includes first and second constant current sources, first and second current mirror circuits, and first and second analog switch circuits. The first and second constant current sources generate constant currents. The first current mirror circuit supplies a constant current having a value corresponding to the constant current generated by the first constant current source to an output terminal. The first current mirror circuit has a first transistor connected to the first constant current source and a second transistor connected to the output terminal. The second current mirror circuit supplies a constant current having a value corresponding to the constant current generated by the second constant current source to the output terminal. The second current mirror circuit has a third transistor connected to the second constant current source and a fourth transistor connected to the output terminal. The first analog switch circuit is connected between the gates of the first and second transistors and turned on/off by a first control pulse. The second analog switch circuit is connected between the gates of the third and fourth transistors and turned on/off by a second control pulse.

10 Claims, 7 Drawing Sheets

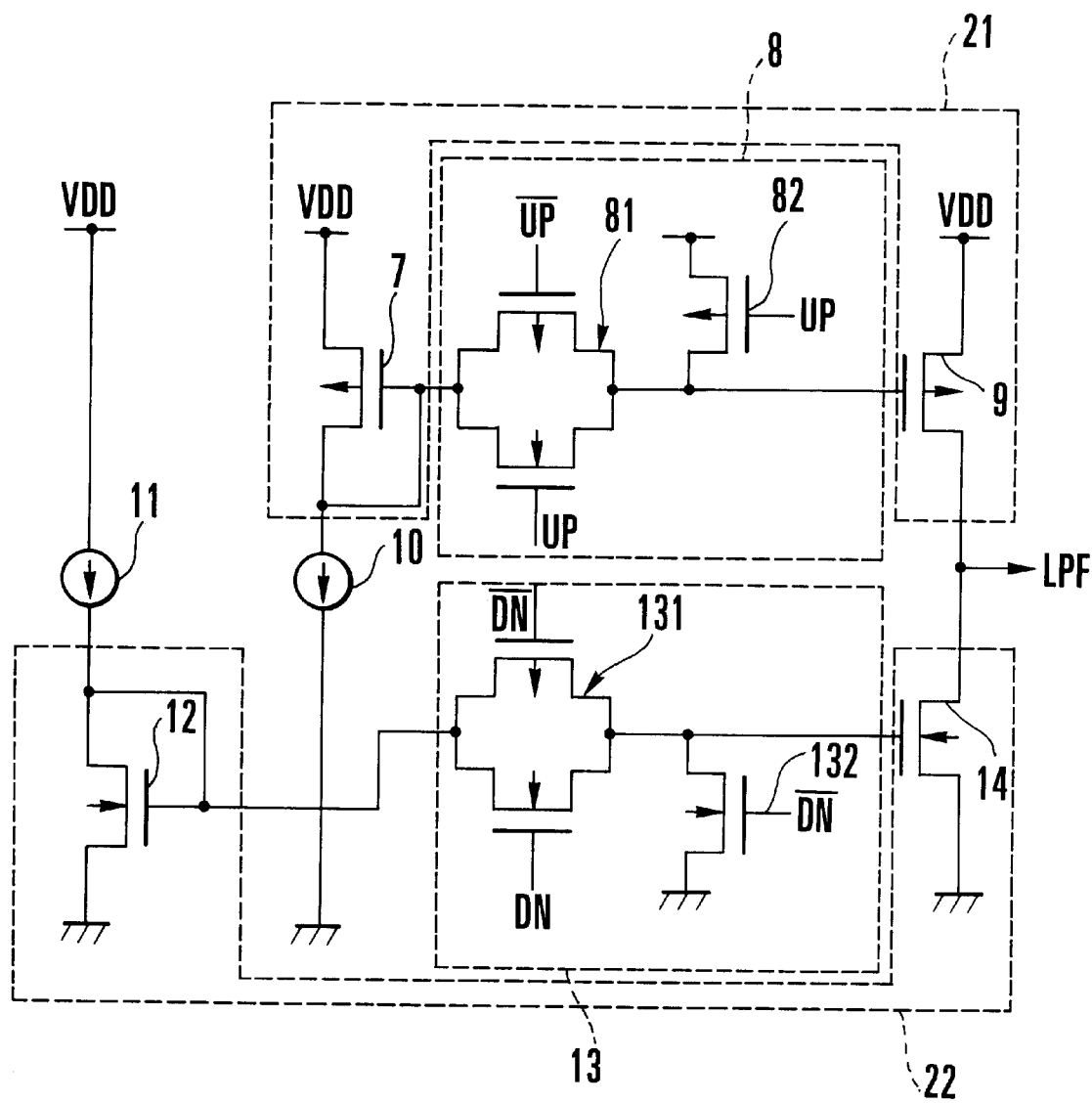
F I G. 1

CHARGE PUMP CIRCUIT FOR PLL

BACKGROUND OF THE INVENTION

The present invention relates to a charge pump circuit for a PLL (Phase Locked Loop) and, more particularly, to a charge pump circuit for a PLL used in an integrated circuit requiring functions such as phasing, frequency multiplication, and clock recovery.

Conventionally, a CMOS IC (Complementary Metal-Oxide Semiconductor Integrated Circuit) requiring functions such as phasing, frequency multiplication, and clock recovery uses a PLL to control the frequency.

FIG. 7 shows the basic arrangement of a general PLL. As shown in FIG. 7, a PLL 1 is constituted by a phase detector (PD) 2, an inverter 3, a charge pump circuit 4, a low-pass filter (LPF) 5, a voltage-controlled oscillator (VCO) 6, and a frequency divider 6a.

The PD 2 compares the phases of a reference clock and an output from the frequency divider 6a. When the phase of an output from the frequency divider lags from the phase of the reference clock, the PD 2 outputs a pulse (to be referred to as a signal UP) for increasing the frequency. When the phase of an output from the frequency divider leads from the phase of the reference clock, the PD 2 outputs a pulse (to be referred to as a signal DN) for decreasing the frequency. As the signal UP, a signal $\overline{UP}$ inverted by the inverter 3 is used.

The output of the charge pump circuit 4 is connected to the LPF 5 made up of a resistor 5a and a capacitor 5b. The charge pump circuit 4 removes electric charges from the capacitor 5b of the LPF 5 when the charge pump circuit 4 receives the signal DN, and accumulates electric charges in the capacitor 5b of the LPF 5 when the charge pump circuit 4 receives the signal $\overline{UP}$. A pulse output from the charge pump circuit 4 is converted into a DC analog signal by the LPF 5.

The VCO 6 receives the analog signal output from the LPF 5 and outputs a constant-frequency signal. The frequency divider 6a is formed from a counter, and divides an output from the VCO 6 into N (N: arbitrary natural number) to supply the divided output to the PD 2.

In the PLL 1, the PD 2, charge pump circuit 4, VCO 6, and frequency divider 6a form one loop, and this loop controls the phases, i.e., frequencies of two input signals to the PD 2 to be equal to each other. The frequency of an output from the VCO 6 is N times the input frequency. By arbitrarily setting the value N, a frequency which is an arbitrary natural multiple of the input frequency can be obtained.

A conventional charge pump circuit will be explained with reference to FIGS. 8A and 8B. As shown in FIGS. 8A and 8B, a power supply VDD is connected to a constant current source 22, and the constant current source 22 is connected to the source of a PMOS transistor 20. Ground is connected to a constant current source 23, and the constant current source 23 is connected to the source of an NMOS transistor 21. The drains of the PMOS and NMOS transistors 20 and 21 are connected to an LPF on the next stage.

FIG. 8A schematically shows the case of supplying the signal $\overline{UP}$. That is, when the signal $\overline{UP}$ is at "L" level, the PMOS transistor 20 serving as an analog switch is turned on to supply a current $i_{OH}$ to the LPF.

A parasitic capacitance Cfp exists between a node C and the power supply VDD. When the PMOS transistor 20 switches from the OFF state to the ON state, the potential of the source side of the PMOS transistor 20, i.e., the potential of the node C changes from the power supply potential to the filter potential, and a current $i_{cfp}$ based on the potential difference and Cfp abruptly flows into the LPF.

FIG. 8B schematically shows the case of supplying the signal DN. That is, when the signal DN is at "H" level, the NMOS transistor 21 serving as an analog switch is turned on to flow a current $i_{OL}$ from the LPF.

A parasitic capacitance Cfn exists between a node D and ground. When the NMOS transistor 21 switches from the OFF state to the ON state, the potential of the source side of the NMOS transistor 21, i.e., the potential of the node D changes from ground potential to the filter potential, and a current $i_{cfn}$ based on the potential difference and Cfn abruptly flows from the LPF.

As a result, the following problem occurs at the output of the charge pump circuit.

FIG. 9 shows an output current from the charge pump circuit in FIGS. 8A and 8B. As shown in FIG. 9, the currents $i_{cfp}$ and $i_{cfn}$ generate overshoots in an output current from the charge pump circuit to cause jitters in the VCO. The phase is permanently repeatedly controlled by an output from the VCO having the jitters, resulting in system errors.

The value of an overshoot current is the product of the potential difference between the potential of the LPF and the power supply voltage by the magnitude of the parasitic capacitance. For this reason, the overshoot can be eliminated by making the potentials of the nodes C and D equal to the potential of the LPF when the transistors 20 and 21 are in the OFF state.

From this viewpoint, the prior art proposed a charge pump circuit like the one shown in FIG. 10.

FIG. 10 shows a conventional charge pump circuit having a function of suppressing an overshoot in an output current. As shown in FIG. 10, CMOS transistors 30 and 31 constituting an analog switch are series-connected between two constant current sources 32 and 33 arranged between the power supply VDD and ground. Each of the CMOS transistors 30 and 31 is made up of a parallel circuit of PMOS and NMOS transistors.

The other terminal of the constant current source 32 having one terminal connected to the power supply VDD is connected to one terminal of a CMOS transistor 34. The other terminal of the constant current source 33 having one terminal connected to ground is connected to one terminal of a CMOS transistor 35.

The connection point between the CMOS transistors 30 and 31 is connected to the non-inverting input terminal of an operational amplifier 36 and the LPF. The output terminal of the operational amplifier 36 is connected to its inverting input terminal, the other terminal of the CMOS transistor 34, and the other terminal of the CMOS transistor 35.

The operational amplifier 36 incorporates a phase compensation capacitor (not shown) for preventing oscillation.

The CMOS transistors 30 and 31 and the CMOS transistors 34 and 35 operate in opposite phases. In other words, while the CMOS transistors 30 and 31 are in the OFF state, the CMOS transistors 34 and 35 are in the ON state. The potentials of the nodes E and G are made equal to the potential of the node F (i.e., the potential of the LPF) by feedback at the operational amplifier 36. Even if the CMOS transistors 30 and 31 are turned on, the potentials of the nodes E and G do not change, and no overshoot is generated in an output current.

However, the capacitor (not shown) in the operational amplifier 36 has a capacitance of about 6 pF. When this charge pump circuit is actually laid out on a chip, the capacitor occupies a large area with respect to the layout area, which interferes with downsizing the chip.

SUMMARY OF THE INVENTION

It is an object of the present invention to provide a charge pump circuit for a PLL capable of downsizing the chip without using any operational amplifier.

It is another object of the present invention to provide a charge pump circuit for a PLL capable of stably operating while suppressing an overshoot generated in an output waveform.

To achieve the above objects, according to the present invention, there is provided a charge pump circuit for a PLL, comprising first and second constant current sources for generating constant currents, a first current mirror circuit for supplying a constant current having a value corresponding to the constant current generated by the first constant current source to an output terminal, the first current mirror circuit having a first transistor connected to the first constant current source and a second transistor connected to the output terminal, a second current mirror circuit for supplying a constant current having a value corresponding to the constant current generated by the second constant current source to the output terminal, the second current mirror circuit having a third transistor connected to the second constant current source and a fourth transistor connected to the output terminal, a first analog switch circuit which is connected between gates of the first and second transistors and turned on/off by a first control pulse, and a second analog switch circuit which is connected between gates of the third and fourth transistors and turned on/off by a second control pulse.

BRIEF DESCRIPTION OF THE DRAWINGS

FIG. 1 is a circuit diagram showing a charge pump circuit for a PLL according to the first embodiment of the present invention;

DESCRIPTION OF THE PREFERRED EMBODIMENTS

Figure 2:
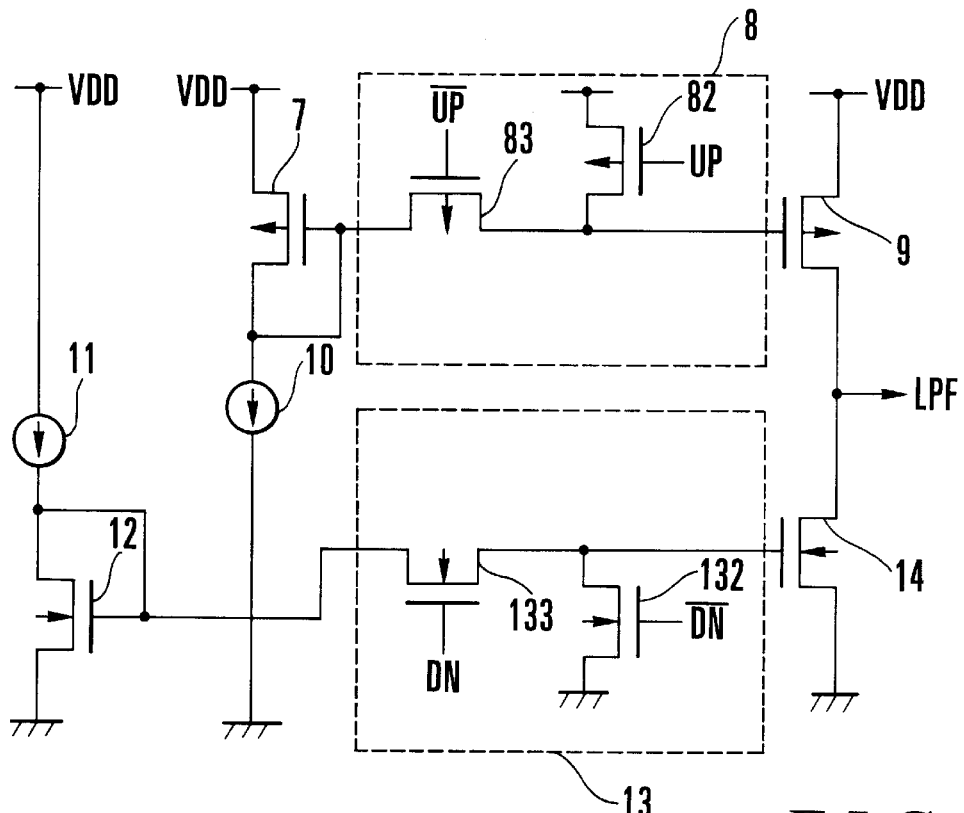
FIG. 2 is a circuit diagram showing a charge pump circuit for a PLL according to the second embodiment of the present invention.

The present invention will be described in detail below with reference to the accompanying drawings.

First Embodiment

FIG. 1 shows a charge pump circuit for a PLL according to the first embodiment of the present invention. In FIG. 1, the charge pump circuit of the first embodiment is constituted by a first current mirror circuit 21 made up of PMOS transistors 7 and 9, a second current mirror circuit 22 made up of NMOS transistors 12 and 14, constant current sources 10 and 11, and first and second analog switch circuits 8 and 13.

The PMOS transistor 7 having a source connected to a power supply VDD and a drain connected to the constant current source 10, and the PMOS transistor 9 having a source connected to the power supply VDD constitute the current mirror circuit 21, as described above. The first analog switch circuit 8 made up of a CMOS transistor 81 serving as a transfer gate and a PMOS transistor 82 is connected between the gates of the PMOS transistors 7 and 9.

In the first analog switch circuit 8, the CMOS transistor 81 is series-connected between the gates of the PMOS transistors 7 and 9, and the PMOS transistor 82 is connected between the power supply VDD and the gate of the PMOS transistor 9. The gate of the CMOS transistor 81 on the PMOS transistor side receives a signal $\overline{UP}$, and the gate on the NMOS transistor side receives a signal UP. The gate of the PMOS transistor 82 receives the signal UP.

The NMOS transistor 12 having a source connected to ground and a drain connected to the constant current source 11, and the NMOS transistor 14 having a source connected to ground constitute the second current mirror circuit 22, as described above. The second analog switch circuit 13 made up of a CMOS transistor 131 serving as a transfer gate and an NMOS transistor 132 is connected between the gates of the NMOS transistors 12 and 14.

In the second analog switch circuit 13, the CMOS transistor 131 is series-connected between the gates of the NMOS transistors 12 and 14, and the NMOS transistor 132 is connected between the gate of the NMOS transistor 14 and ground. The gate of the CMOS transistor 131 on the PMOS transistor side receives a signal $\overline{DN}$, and the gate on the NMOS transistor side receives a signal DN. The gate of the NMOS transistor 132 receives a signal $\overline{DN}$.

The current mirror circuits 21 and 22 supply constant currents having values corresponding to constant currents generated by the constant current sources 10 and 11 to the LPF via output terminals. The MOS transistors 7, 9, 12, 14, 81, 82, 131, and 132 are formed from MOSFETs (Field Effect Transistors).

Operation of the charge pump circuit having this arrangement will be explained.

When both the signals UP and DN are at "L" level, both the CMOS transistors 81 and 131 are in the OFF state, both the PMOS and NMOS transistors 82 and 132 are in the ON state, and both the PMOS and NMOS transistors 9 and 14 are in the OFF state. No current is therefore output to the LPF.

When the signal UP is at "H" level, the CMOS transistor 81 is turned on, and the CMOS transistor 131 is turned off. The gates of the PMOS transistors 7 and 9 constituting the current mirror circuit 21 are connected to flow a current corresponding to the mirror ratio of the PMOS transistors 7 and 9 to the PMOS transistor 9. The current flows from the power supply VDD to the LPF via the PMOS transistor 9.

When the signal DN is at "H" level, the CMOS transistor 131 is turned on, and the NMOS transistor 132 is turned off. The gates of the NMOS transistors 12 and 14 constituting the current mirror circuit 22 are connected to flow a current corresponding to the mirror ratio of the NMOS transistors 12 and 14 through the NMOS transistor 14. The current flows from the LPF to ground via the NMOS transistor 14.

Figure 6:
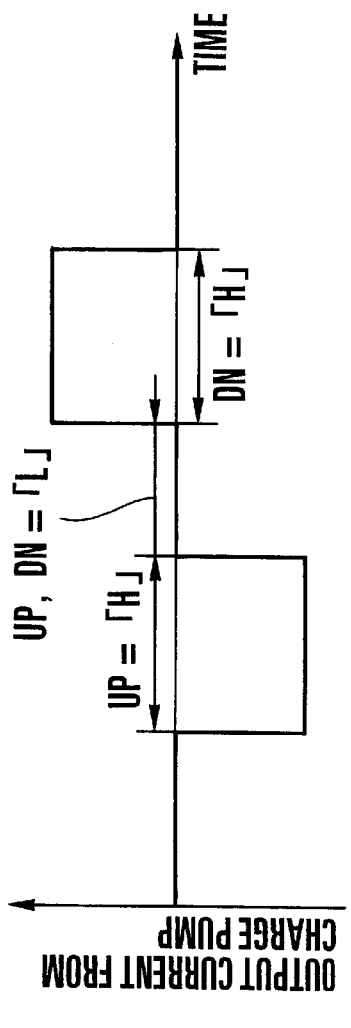
FIG. 6 is a waveform chart showing an output current from the charge pump circuit in FIG. 1.
Figure 7:
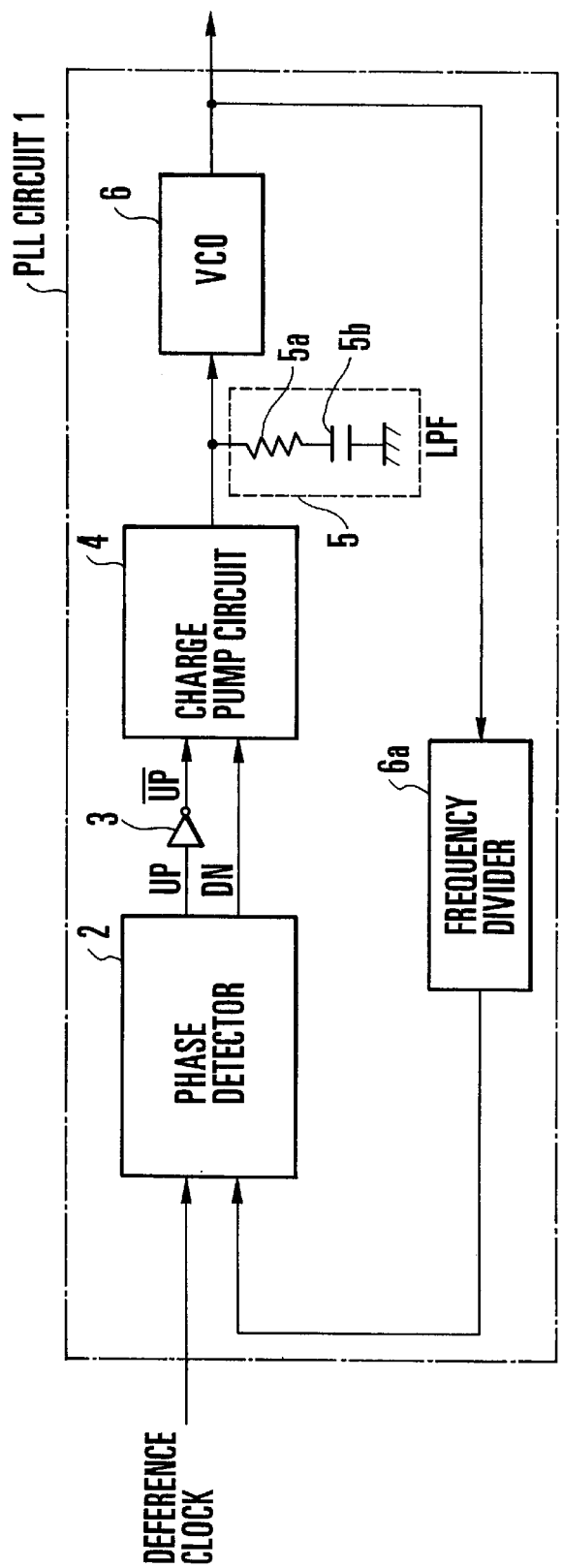
FIG. 7 is a block diagram showing a general PLL.
Figure 8A:
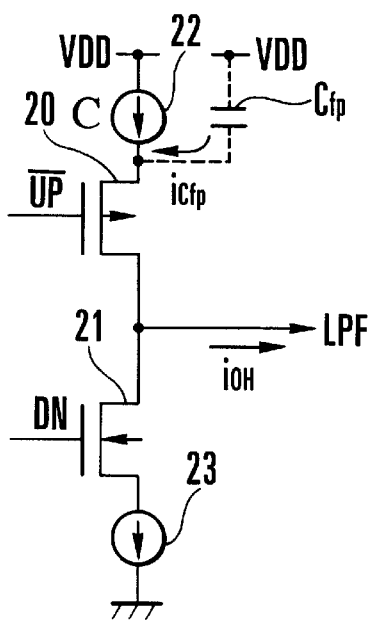
FIGS. 8A and 8B are circuit diagrams showing an example of a conventional charge pump circuit for a PLL.
Figure 8B:
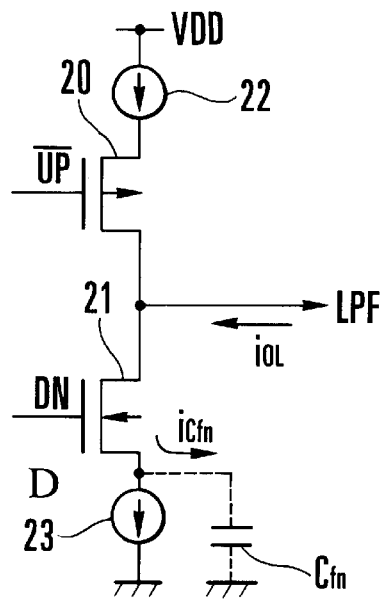
Figure 9:
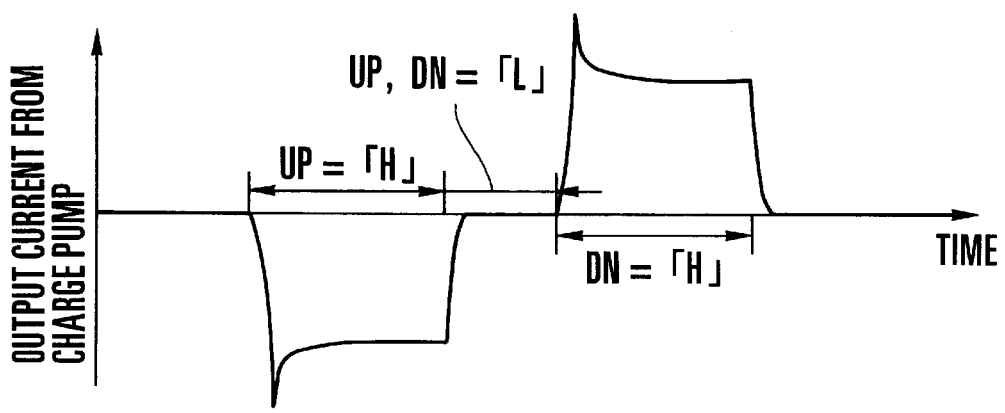
FIG. 9 is a waveform chart showing an output current from the charge pump circuit in FIGS. 8A and 8B.

According to the first embodiment, even if the PMOS and NMOS transistors 9 and 14 are selectively turned on, the potentials on the source sides of the PMOS and NMOS transistors 9 and 14 do not change, and no overshoot is generated in an output current, as shown in FIG. 6.

Second Embodiment

FIG. 2 shows a charge pump circuit according to the second embodiment of the present invention. In FIG. 2, the same reference numerals as in FIG. 1 denote the same parts. In the second embodiment, PMOS and NMOS transistors 83 and 133 respectively replace the CMOS transistors 81 and 131.

Operation of the second embodiment is the same as in FIG. 1 as follows.

When both the signals UP and DN are at "L" level, both the PMOS and NMOS transistors 83 and 133 are in the OFF state, both PMOS and NMOS transistors 82 and 132 are in the ON state, and both PMOS and NMOS transistors 9 and 14 are in the OFF state. No current is therefore output to the LPF.

When the signal UP is at "H" level, the PMOS transistor 83 is turned on, and the PMOS transistor 82 is turned off. The gates of PMOS transistors 7 and 9 constituting a current mirror circuit are connected to flow a current corresponding to the mirror ratio of the PMOS transistors 7 and 9 to the PMOS transistor 9. The current flows from the power supply VDD to the LPF via the PMOS transistor 9.

When the signal DN is at "H" level, the NMOS transistor 133 is turned on, and the NMOS transistor 132 is turned off. The gates of NMOS transistors 12 and 14 constituting a current mirror circuit are connected to flow a current corresponding to the mirror ratio of the NMOS transistors 12 and 14 to the NMOS transistor 14. The current flows from the LPF to ground via the NMOS transistor 14.

According to the second embodiment, even if the PMOS and NMOS transistors 9 and 14 are selectively turned on, the potentials on the source sides of the PMOS and NMOS transistors 9 and 14 do not change, and no overshoot is generated in an output current, as in the first embodiment.

Third Embodiment

Figure 3:
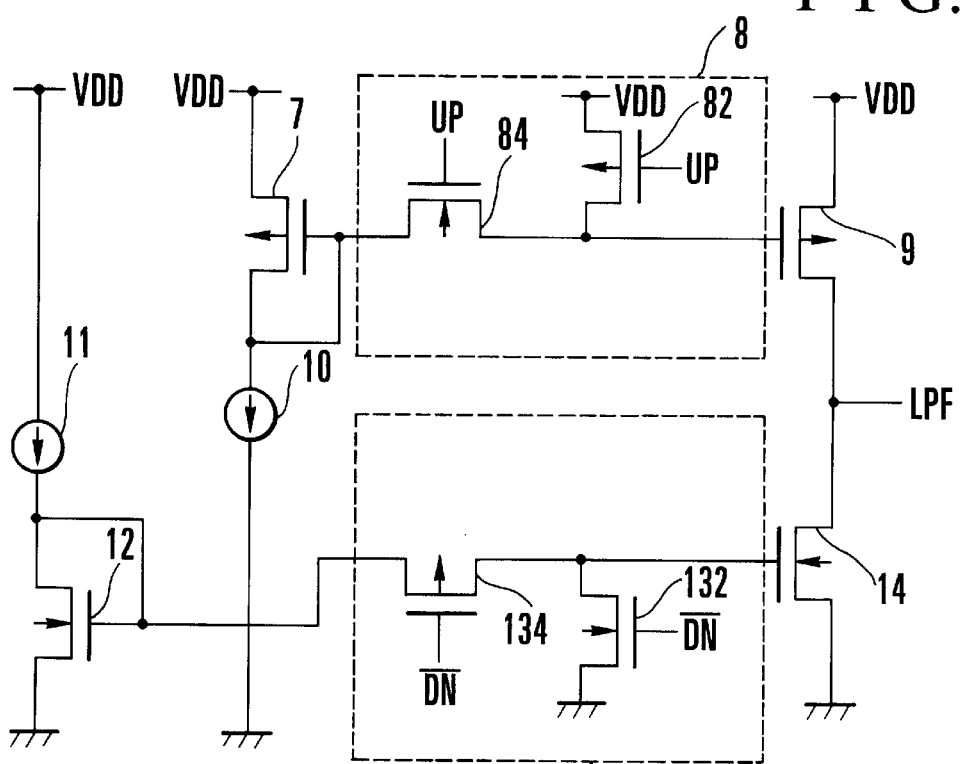
FIG. 3 is a circuit diagram showing a charge pump circuit for a PLL according to the third embodiment of the present invention.

FIG. 3 shows a charge pump circuit according to the third embodiment of the present invention. In FIG. 3, the same reference numerals as in FIG. 1 denote the same parts. In the third embodiment, NMOS and PMOS transistors 84 and 134 respectively replace the CMOS transistors 81 and 131.

Operation of the third embodiment is the same as in FIG. 1 as follows.

When both the signals UP and DN are at "L" level, both the NMOS and PMOS transistors 84 and 134 are in the OFF state, both PMOS and NMOS transistors 82 and 132 are in the ON state, and both PMOS and NMOS transistors 9 and 14 are in the OFF state. No current is therefore output to the LPF.

When the signal UP is at "H" level, the NMOS transistor 84 is turned on, and the PMOS transistor 82 is turned off. The gates of PMOS transistors 7 and 9 constituting a current mirror circuit are connected to flow a current corresponding to the mirror ratio of the PMOS transistors 7 and 9 to the PMOS transistor 9. The current flows from the power supply VDD to the LPF via the PMOS transistor 9.

When the signal DN is at "H" level, the PMOS transistor 134 is turned on, and the NMOS transistor 132 is turned off. The gates of NMOS transistors 12 and 14 constituting a current mirror circuit are connected to flow a current corresponding to the mirror ratio of the NMOS transistors 12 and 14 to the NMOS transistor 14. The current flows from the LPF to ground via the NMOS transistor 14.

According to the third embodiment, even if the PMOS and NMOS transistors 9 and 14 are selectively turned on, the potentials on the source sides of the PMOS and NMOS transistors 9 and 14 do not change, and no overshoot is generated in an output current, as in the first embodiment.

Fourth Embodiment

Figure 4:
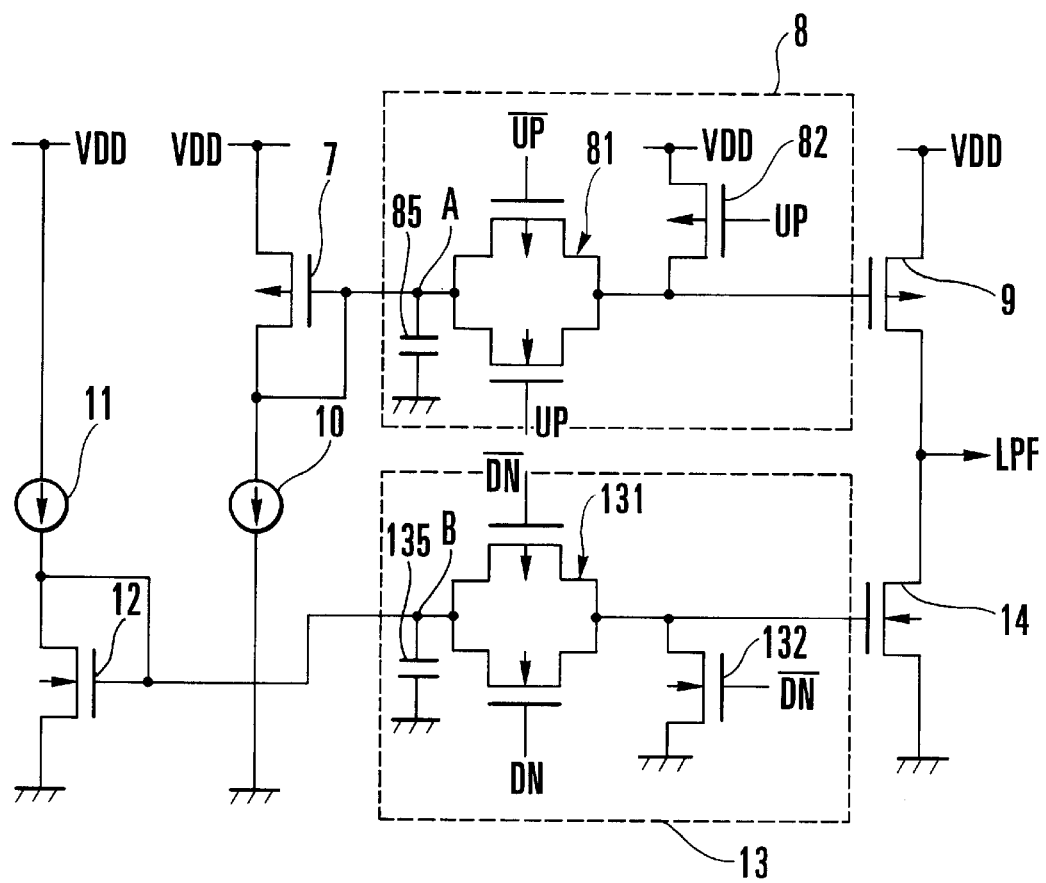
FIG. 4 is a circuit diagram showing a charge pump circuit for a PLL according to the fourth embodiment of the present invention.

FIG. 4 shows a charge pump circuit according to the fourth embodiment of the present invention. In FIG. 4, the same reference numerals as in FIG. 1 denote the same parts. In the fourth embodiment, capacitors 85 and 135 are respectively arranged between the gates (nodes A and B in FIG. 4) of PMOS and NMOS transistors 7 and 12 and ground. Operation of the fourth embodiment is the same as in FIG. 1.

According to the fourth embodiment, even if PMOS and NMOS transistors 9 and 14 are repeatedly turned on/off, the potentials at the nodes A and B hardly vary.

Figure 10:
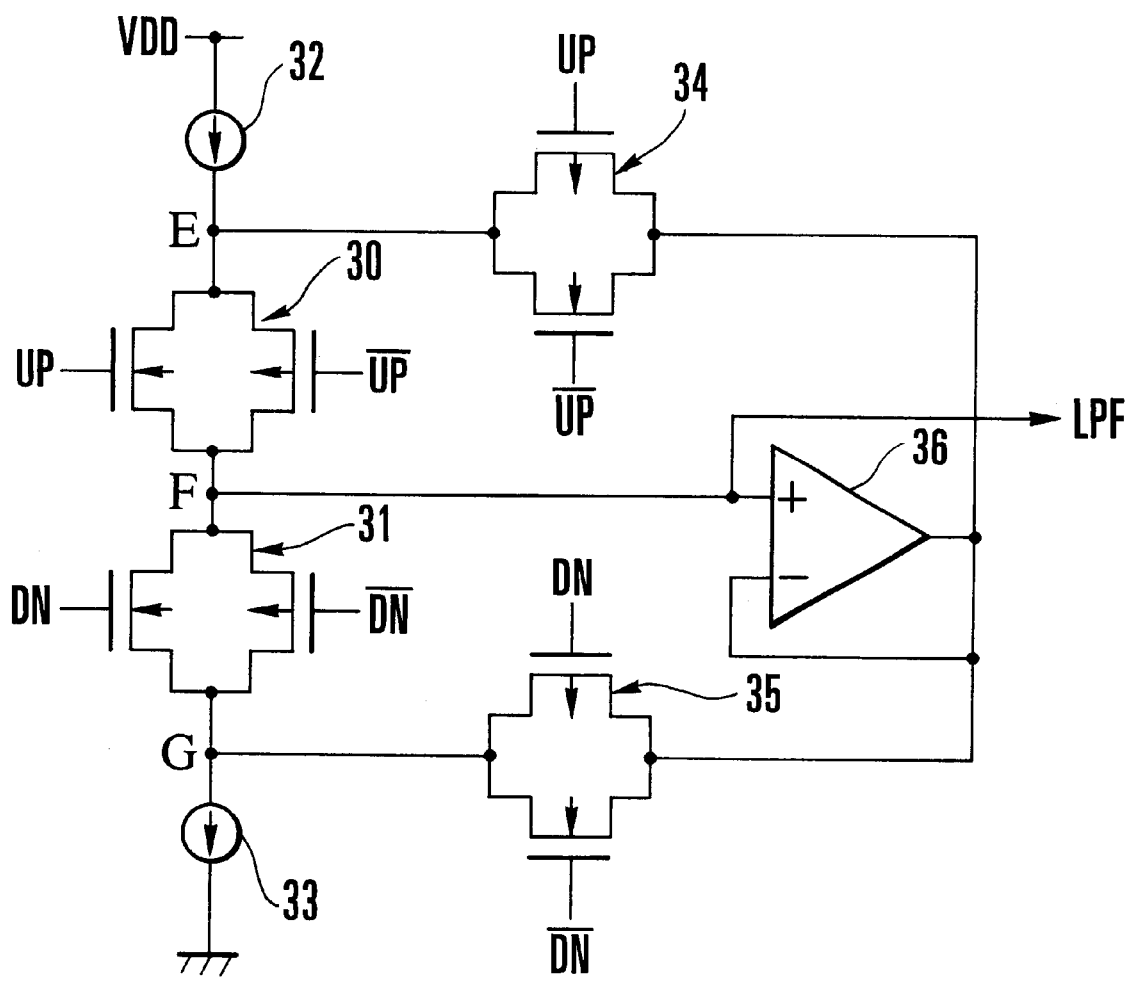
FIG. 10 is a circuit diagram showing another example of a conventional charge pump circuit for a PLL.

The capacitors 85 and 135 used in the fourth embodiment need not be so large in capacitance as the capacitor incorporated in the operational amplifier 36 in FIG. 10, and suffice to be about ⅓ or less. The occupation ratio of the capacitor with respect to the layout area on the chip is smaller than in the circuit shown in FIG. 10, and falls within the allowable range for practical use. Note that when these capacitors are arranged on the circuit shown in FIG. 2 or 3 or a circuit (to be described below) shown in FIG. 5, the same effects can be obtained.

Fifth Embodiment

Figure 5:
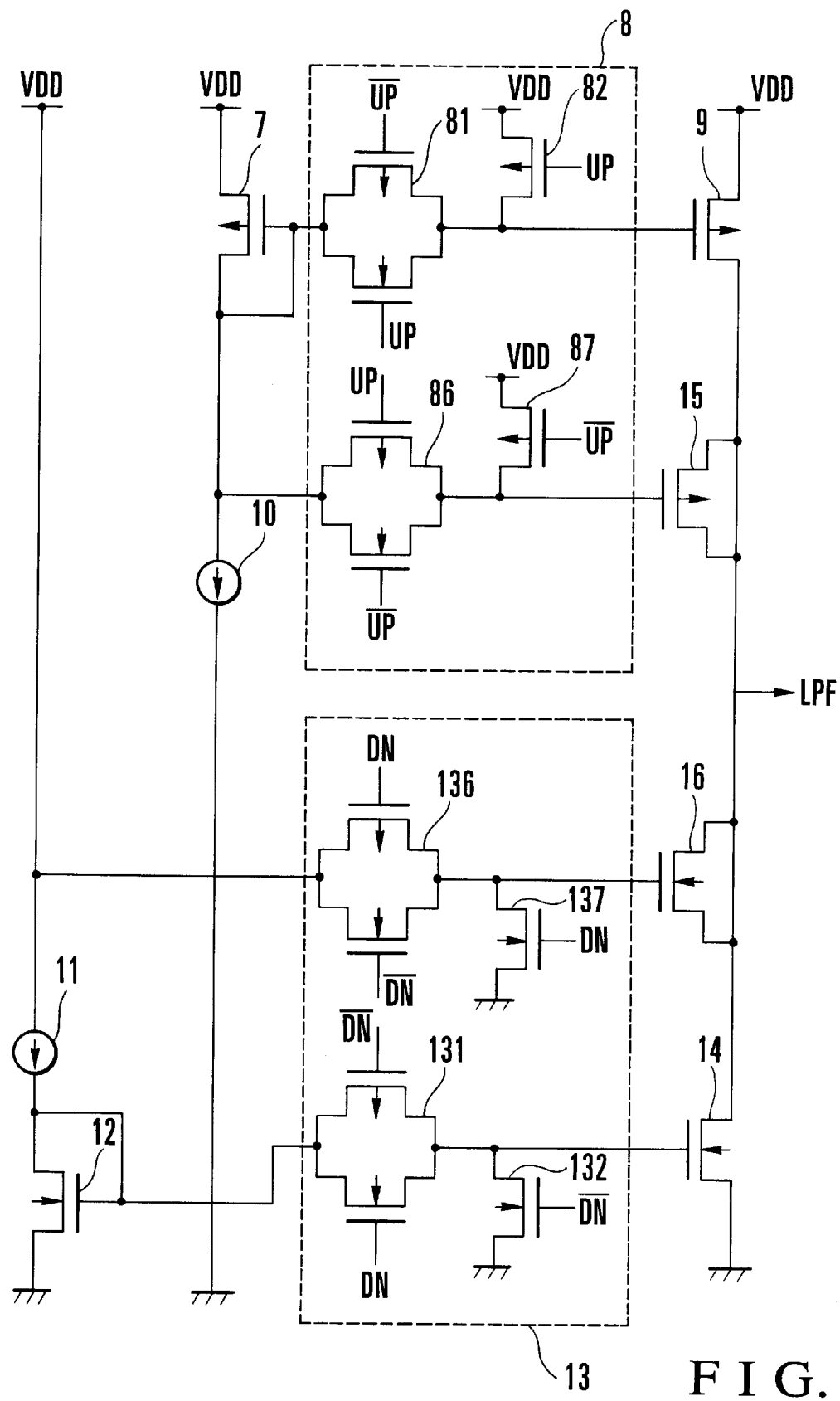
FIG. 5 is a circuit diagram showing a charge pump circuit for a PLL according to the fifth embodiment of the present invention.

FIG. 5 shows a charge pump circuit according to the fifth embodiment of the present invention. In FIG. 5, the same reference numerals as in FIG. 1 denote the same parts. The fifth embodiment adopts dummy transistors 15 and 16 which operate in an opposite phase to the phase for PMOS and NMOS transistors 9 and 14 upon reception of the signals UP and DN.

More specifically, in the fifth embodiment, the same constant current sources 10 and 11 as in FIG. 1 are arranged, and the dummy transistor 15 formed from a PMOS transistor is connected between the PMOS transistor 9 and the output terminal to the LPF. To drive the dummy transistor 15, a CMOS transistor 86 is connected between the gate of the dummy transistor 15 and the connection point between the constant current source 10 and a PMOS transistor 7. A PMOS transistor is connected between the power supply VDD and the gate of the dummy transistor 15.

Similarly, the dummy transistor 16 formed from an NMOS transistor is connected between the NMOS transistor 14 and the output terminal to the LPF. To drive the dummy transistor 16, a CMOS transistor 136 is connected between the gate of the dummy transistor 16 and the connection point between the power supply VDD and the constant current source 11. An NMOS transistor 137 is connected between the gate of the dummy transistor 16 and ground.

The gate areas of the dummy transistors 15 and 16 are respectively about half the areas of the PMOS and NMOS transistors 9 and 14. Since the dummy transistors 15 and 16 operate by a signal in an opposite phase, field through noise between the PMOS and NMOS transistors 9 and 14 can be reduced.

Note that when the dummy transistors 15 and 16 are arranged on the circuit shown in FIG. 2, 3, or 4, the same effects can be obtained.

As has been described above, according to the present invention, a current by a parasitic capacitance generated in the switch can be reduced without using any operational amplifier. Since no phase compensation capacitor need be arranged, the layout area on the chip can be decreased, compared to the conventional charge pump circuit.

What is claimed is:

1. A charge pump for a PLL, comprising:

first and second constant current sources for generating constant currents;

a first current mirror circuit for supplying a constant current having a value corresponding to the constant current generated by said first constant current source to an output terminal, said first current mirror circuit having a first transistor connected to said first constant current source and a second transistor connected to the output terminal;

a second current mirror circuit for supplying a constant current having a value corresponding to the constant current generated by said second constant current source to the output terminal, said second current mirror circuit having a third transistor connected to said second constant current source and a fourth transistor connected to the output terminal;

a first analog switch circuit which is connected between gates of said first and second transistors and turned on/off by a first control pulse;

a second analog switch circuit which is connected between gates of said third and fourth transistors and turned on/off by a second control pulse;

a first dummy transistor connected between said second transistor and the output terminal to operate in an opposite phase to a phase of said second transistor; and a second dummy transistor connected between the output terminal and said fourth transistor to operate in an opposite phase to a phase of said fourth transistor.

2. A circuit according to claim 1, wherein said first and second analog switch circuits comprise a plurality of MOSFETs.

3. A circuit according to claim 2, wherein said first analog switch circuit comprises a first CMOS transistor serving as a transfer gate series-connected between the gates of said first and second transistors, and a PMOS transistor connected between a power supply and the gate of said second transistor; and said second analog switch circuit comprises a second CMOS transistor serving as a transfer gate series-connected between the gates of said third and fourth transistors, and an NMOS transistor connected between a ground and the gate of said fourth transistor.

4. A circuit as claimed in claim 3, wherein the first control pulse for designating increasing a frequency of an output from a PLL (Phase Locked Loop) is supplied to a gate of said PMOS transistor, an inverted signal of the first control pulse is supplied to the gate of said first CMOS transistor, the second control pulse for designating decreasing the frequency of the output from the PLL is supplied to the gate of said second CMOS transistor, and an inverted signal of the second control pulse is supplied to a gate of said NMOS transistor.

5. A circuit according to claim 2, wherein said first analog switch circuit comprises a first PMOS transistor series-connected between the gates of said first and second transistors, and a second PMOS transistor connected between a power supply and the gate of said second transistor; and said second analog switch circuit comprises a first NMOS transistor series-connected between the gates of said third and fourth transistors, and a second NMOS transistor connected between a ground and the gate of said fourth transistor.

6. A circuit according to claim 5, wherein the first control pulse for designating increasing a frequency of an output from a PLL is supplied to a gate of said second PMOS transistor, an inverted signal of the first control pulse is supplied to a gate of said first PMOS transistor, the second control pulse for designating decreasing the frequency of the output from the PLL is supplied to a gate of said first NMOS transistor, and an inverted signal of the first control pulse is supplied to a gate of said second NMOS transistor.

7. A circuit according to claim 2, wherein said first analog switch circuit comprises a first NMOS transistor series-connected between the gates of said first and second transistors, and a first PMOS transistor connected between a power supply and the gate of said second transistor; and said second analog switch circuit comprises a second PMOS transistor series-connected between the gates of said third and fourth transistors, and a second NMOS transistor connected between a ground and the gate of said fourth transistor.

8. A circuit according to claim 7, wherein the first control pulse for designating increasing a frequency of an output from a PLL is supplied to gates of said first NMOS and PMOS transistors, and the second control pulse for designating decreasing the frequency of the output from the PLL is supplied to gates of said second PMOS and NMOS transistors.

9. A circuit according to claim 1, further comprising:

a first capacitor connected between the gate of said first transistor and a power supply; and a second capacitor connected between the gate of said third transistor and ground.

10. A circuit according to claim 1, wherein the first and second control pulses are output from a phase detector for comparing phases of a PLL output and a reference clock.

* * * * *